US007026962B1

(12) United States Patent
Emami et al.

(10) Patent No.: US 7,026,962 B1
(45) Date of Patent: Apr. 11, 2006

(54) TEXT COMPRESSION METHOD AND APPARATUS

(75) Inventors: Shahriar Emami, Sunrise, FL (US); Julio C. Blandon, Miami, FL (US)

(73) Assignee: Motorola, Inc, Schaumburg, IL (US)

( * ) Notice: Subject to any disclaimer, the term of this patent is extended or adjusted under 35 U.S.C. 154(b) by 1204 days.

(21) Appl. No.: 09/626,551

(22) Filed: Jul. 27, 2000

(51) Int. Cl.
*H03M 7/34* (2006.01)

(52) U.S. Cl. ............................ 341/51; 341/59; 341/65; 341/67; 341/106

(58) Field of Classification Search ............ 341/50–51, 341/65, 67, 106; 707/7, 101–102
See application file for complete search history.

(56) References Cited

U.S. PATENT DOCUMENTS

| | | | | |
|---|---|---|---|---|
| 4,809,158 A | * | 2/1989 | McCauley | 707/7 |
| 4,843,389 A | * | 6/1989 | Lisle et al. | 341/106 |
| 5,109,437 A | | 4/1992 | Honda | 382/56 |
| 5,148,541 A | * | 9/1992 | Lee et al. | 707/2 |
| 5,218,700 A | * | 6/1993 | Beechick | 712/300 |
| 5,506,580 A | * | 4/1996 | Whiting et al. | 341/51 |
| 5,640,488 A | * | 6/1997 | Junqua et al. | 704/245 |
| 5,872,530 A | * | 2/1999 | Domyo et al. | 341/106 |
| 5,974,180 A | | 10/1999 | Schwendeman | 382/232 |
| 5,999,949 A | * | 12/1999 | Crandall | 715/532 |
| 6,047,298 A | * | 4/2000 | Morishita | 715/532 |
| 6,289,509 B1 | * | 9/2001 | Kryloff | 717/170 |
| 6,502,064 B1 | * | 12/2002 | Miyahira et al. | 704/7 |
| 6,542,640 B1 | * | 4/2003 | Morihara et al. | 382/229 |

FOREIGN PATENT DOCUMENTS

WO　　WO95/02873　　1/1995

OTHER PUBLICATIONS

Pike, J. "text Compression Using a 4 Bit Coding Scheme," The Computer Journal vol. 24, No. 4, 1981.

* cited by examiner

*Primary Examiner*—Rexford Barnie
*Assistant Examiner*—Nguyen Khai
(74) *Attorney, Agent, or Firm*—Motorola, Inc.

(57) ABSTRACT

A technique for constructing a dictionary word list for use in a data compressor is provided by determining a set of words that are included in the dictionary word list and sorting each subset of words having a common starting character by lengths of the words. Partitions are formed and identified based on the common starting character and word length, with each partition being stored in memory and indexed.

1 Claim, 10 Drawing Sheets

TEXT COMPRESSION METHOD AND APPARATUS

FIELD OF THE INVENTION

This invention relates in general to data communication methods and devices, and in particular to a method and apparatus for compressing text efficiently for transmission in a communication system.

BACKGROUND OF THE INVENTION

Static and dynamic dictionary methods for compressing text or data files and messages are well known to one of ordinary skill in the art. A variety of static dictionary compression techniques have been described for use in communication systems in which short and medium length messages are transmitted using transmission medium such as radio, in which the signal conveying the message can undergo substantial distortion. Dynamic dictionary techniques have been described and used for compressing large files, such as for large files that are stored on hard disk.

The rapidly expanding transmission of data files that has resulted from the widespread use of the Internet emphasizes a need for continued improvement of data compression techniques.

DESCRIPTION OF THE PREFERRED EMBODIMENT

Figure 1:
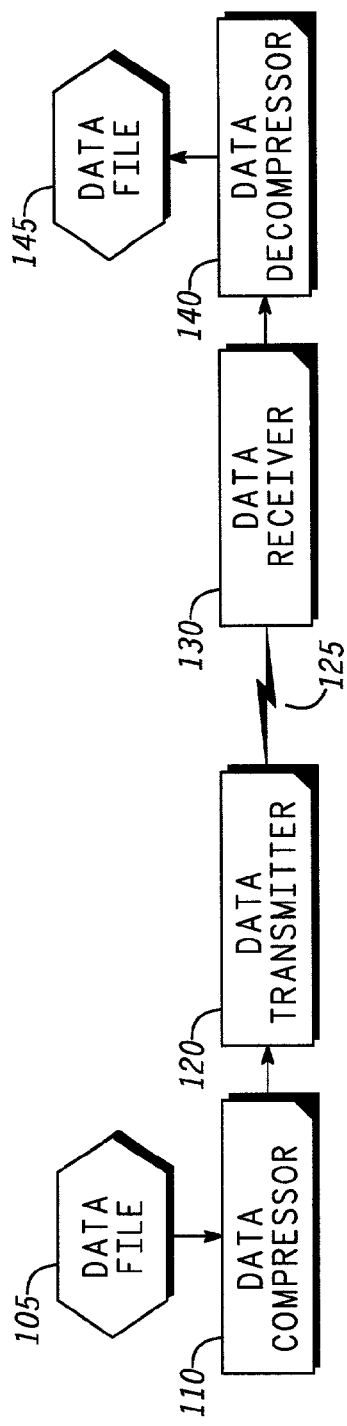
FIG. 1 shows a block diagram of a data compression system, in accordance with the preferred embodiment of the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. Further, the terms and words used herein are not to be considered limiting, but rather merely descriptive. In the description below, like reference numbers are used to describe the same, similar, or corresponding parts in the several views of the drawings.

Referring to FIG. 1, an electrical block diagram of components used in a data communication system 100 to communicate a data file 105 in one direction is shown, in accordance with the preferred embodiment of the present invention. The data file 105 can be any type of data file, such as a text message, a source code file, or a text database.

The data communication system 100 comprises a data compressor 110 that acquires the data file 105 from a memory such as a random access memory and generates a compressed data file using the unique technique described herein. The compressed data file is coupled to a data transmitter 120 that converts the compressed data file into information that is encoded with error protection and modulated onto an transmission signal 125, such as a radio signal used in a cellular telephone system or an analog voltage such as used in a public switched telephone network (PSTN). The transmission signal 125 is received by a data receiver 130 that demodulates and error decodes the information, generating a compressed file that is equivalent to the compressed data file, except for any uncorrected errors caused by distortion of the transmission signal 125. The compressed file generated by the data receiver 130 is then coupled to a data decompressor 140 that decompresses the compressed file, generating a decompressed data file 145 that is identical to the original data file 105 but for any errors caused by the distortion of the transmission signal 125. It will be appreciated that the components described with reference to FIG. 1 are portions of electronic devices comprising the communication system 100, and that the blocks shown in FIG. 1 are duplicated for bi-directional transmission of compressed messages in many devices.

Figure 2:
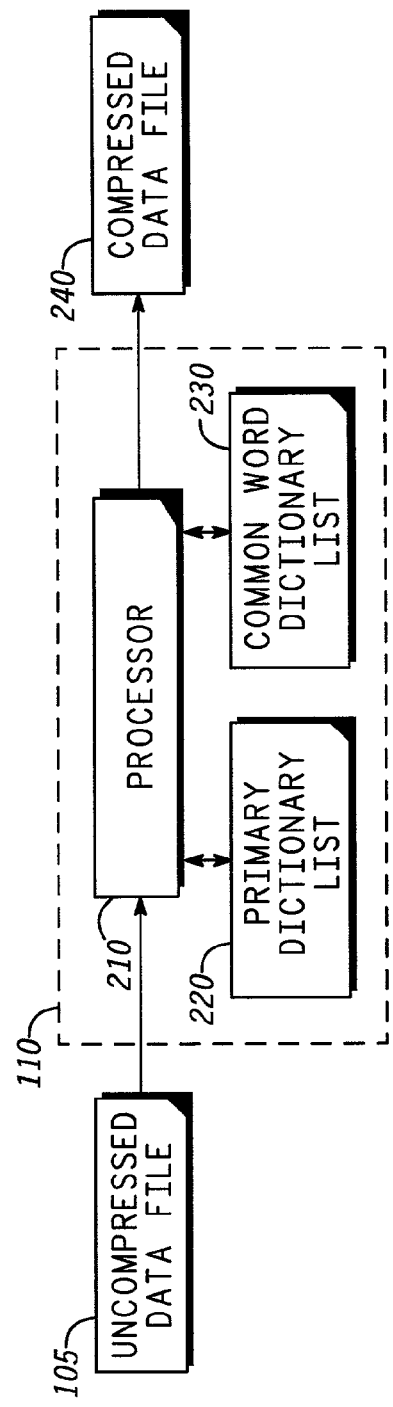
FIG. 2 is a block diagram of a data compressor used in the data compression system, in accordance with the preferred embodiment of the present invention.

Referring to FIG. 2, a block diagram of the data compressor 110 is shown, in accordance with the preferred embodiment of the present invention. The data compressor 110 comprises a processor 210 coupled to a primary dictionary list (PDL) 220 and a common word dictionary list (CWDL) 230. The processor 210 is implemented as microprocessor, a computer, or any other conventional computing hardware, and includes a memory or memory combination, such as a hard disk drive and random access memory combination, that stores programming instructions that are executed by central processing unit of the processor 210. The programming instructions are uniquely organized to generate a compressed data file 240 from the uncompressed data file 105. The data file 105 and compressed data file 240 are stored in read-writeable memory of conventional type, such as a hard disk or random access memory.

Figure 3:
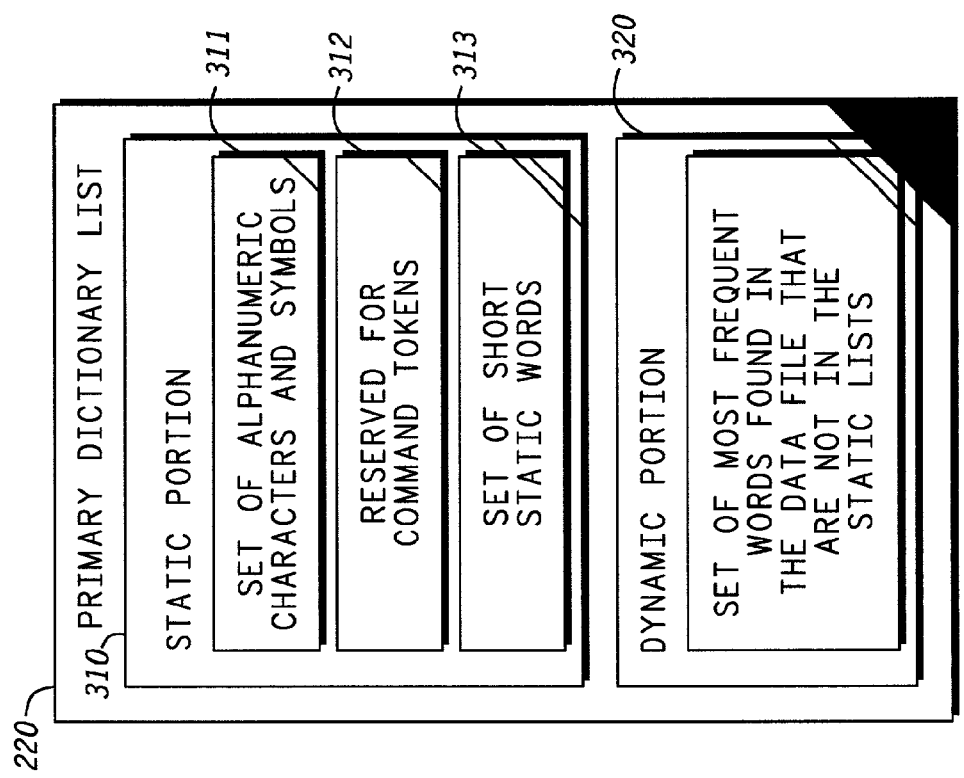
FIG. 3 is a memory map of a primary dictionary list used by the data compressor, in accordance with the preferred embodiment of the present invention.

The PDL 220 is preferably a small segment of random access memory (RAM), certain contents of which are pointed to by the processor 210 using one of a plurality of index bytes or pointers, herein called primary tokens, before and during the compression of the data file 105. Referring to FIG. 3, a memory map of the PDL 220 is shown, in accordance with the preferred embodiment of the present invention. The PDL 220 comprises a static portion 310, a dynamic portion 320, and an index (not shown in FIG. 3). The static portion 310 could be implemented using most any type of memory hardware, such as read only memory (ROM) or random access memory (RAM). However, because the dynamic portion 320 must be re-writeable, it is preferable that the PDL 220 is implemented as a RAM or equivalent. Preferably, items in the PDL 220 are indexed by eight bit bytes (primary tokens), so there are a maximum number of 256 such items. As will be described below, the items are short (all are less than four characters each, and most are one character or symbol), so that a small RAM memory is a convenient implementation for the PDL 220.

The static portion 310 comprises two sets of items 311, 313, each item being identified (pointed to) by a different primary token. These primary tokens form two sets of primary tokens corresponding to the two sets of items 311, 313. A third set of primary tokens is reserved for a few (3 in the preferred embodiment of the present invention) commands 312 that are used in the encoding process. These command tokens preferably do not have any corresponding items stored in the PDL 220; they are used to indicate that the next two bytes within a compressed data file 240 identify a word from the common word dictionary list and to provide capitalization characteristics as shown below in Table 1. The command token together with the next two bytes is called a common word token.

TABLE 1

| Command token value | Capitalization characteristics of the common word identified by the common word token |
|---|---|
| 135 | No capital letters |
| 168 | The first letter is capitalized |
| 170 | All letters are capitalized |

The set of commonly used alphanumeric characters and symbols 311 preferably comprises those alphanumeric characters represented by ASCII (American Standard for the Coded Interchange of Information) values 0 to 127 plus a number of other selected ASCII values in the range 128 to 255 (including, for instance, slanted quotation marks, the copyright symbol, and the trademark symbol). The 128 items having token values from 0 to 127, although forming a part of the dictionary list 220, are not stored in the dictionary list 220 since the ASCII value is the same as the item value.

The set of short static words 313 comprises a predetermined quantity of the most commonly used words of less than four characters. In this example, the predetermined quantity is 37. Such words are determined using a set of test files, in a manner well known in the art of formulating static dictionaries for data compression. The test set of files includes, for example, a sampling of a predetermined set of books, magazine, and newspaper articles. The predetermined quantity is preferably 40 characters. Table 2 shows an exemplary list of some of the short static words 313.

TABLE 2

| ASCII Value | Static Word |
|---|---|
| 254 | the |
| 253 | The |
| 252 | to |

TABLE 2-continued

| ASCII Value | Static Word |
|---|---|
| 251 | of |
| 250 | a |
| 249 | I |
| 248 | and |
| 247 | is |
| 246 | in |
| 245 | it |
| 244 | for |
| 243 | you |
| 242 | on |
| 241 | be |
| 240 | are |
| 239 | not |
| 238 | or |
| 237 | as |
| 236 | was |

The dynamic portion 320 comprises a set of most frequent words found in a data file that are not in the set of short static words, and not in the CWDL 230. Each word in this set of words is identified by a primary token that is called a dynamic word token, and the location of each word in the set is identified by an encoding and decoding pointer in an index of encoding and decoding pointers. The formulation of the dynamic portion 320 of the PDL 220 is described more fully after the following description of the CWDL 230, which is done with reference to FIG. 4.

It will be appreciated that the PDL 220 includes some words that are more than one character in length. In accordance with the preferred embodiment of the present invention, three eight bit bytes are reserved for every item that corresponds to the tokens having values 128 to 255, and the location of any one of them is found by using an offset calculation that is well known to one of ordinary skill in the art. Therefore, some of the primary tokens indicate a corresponding word in the primary dictionary by means of intermediate pointers called encoding and decoding pointers that are stored in the index. However, the tokens having values from 0 to 127 do not point to any memory location since they directly represent the ASCII symbol by their value. Thus, the primary word dictionary list comprises a "virtual" list for the tokens having values from 0 to 127.

Other arrangements could be used for identifying each character, symbol, and word in the PDL 220. For example, the primary tokens having values 128 to 255 point could point to symbols or words by means of an intermediate decoding pointer table that stores the address of the symbol or beginning of a word.

The common word dictionary list (CWDL) 230 comprises a list of 65,536 items. In the preferred embodiment of the present invention, the items in the CWDL 230 are 65,426 of the most common words of more than three characters, determined from the set of test files described above, and the 110 ASCII symbols that are not identified by the primary tokens. Each item is identified by a three word "common word token" comprising two eight bit words preceded by a predetermined one of the command tokens that identifies the two tokens following it as a 16 bit pointer to one of the items in the CWDL 230. In accordance with the preferred embodiment of the present invention, an intermediate decoding pointer table 490 is used to identify the 110 ASCII symbol locations and the location of the beginning of the 65,536 common words, with each pointer pointing to one such symbol or word.

Figure 4:
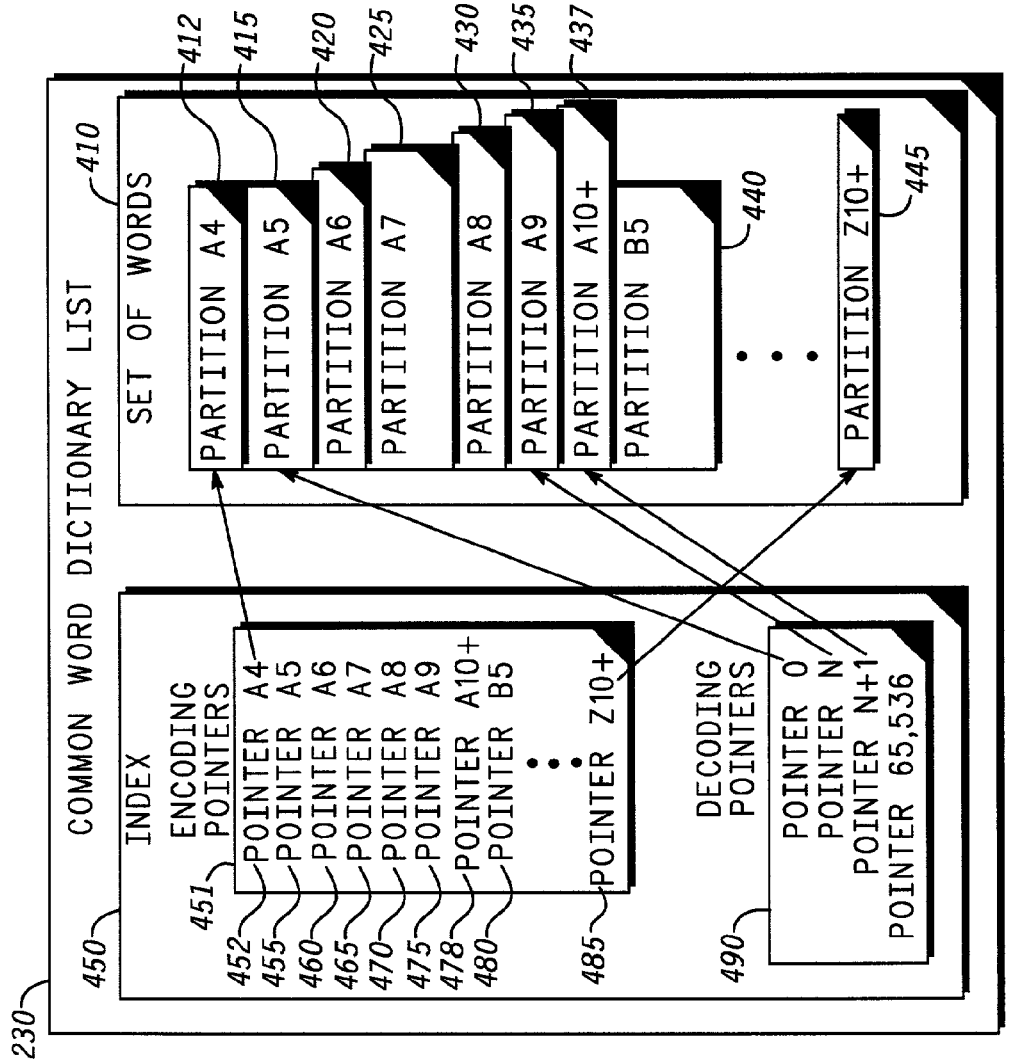
FIG. 4 is a memory map of a common word dictionary list used by the data compressor, in accordance with the preferred embodiment of the present invention.
Figure 5:
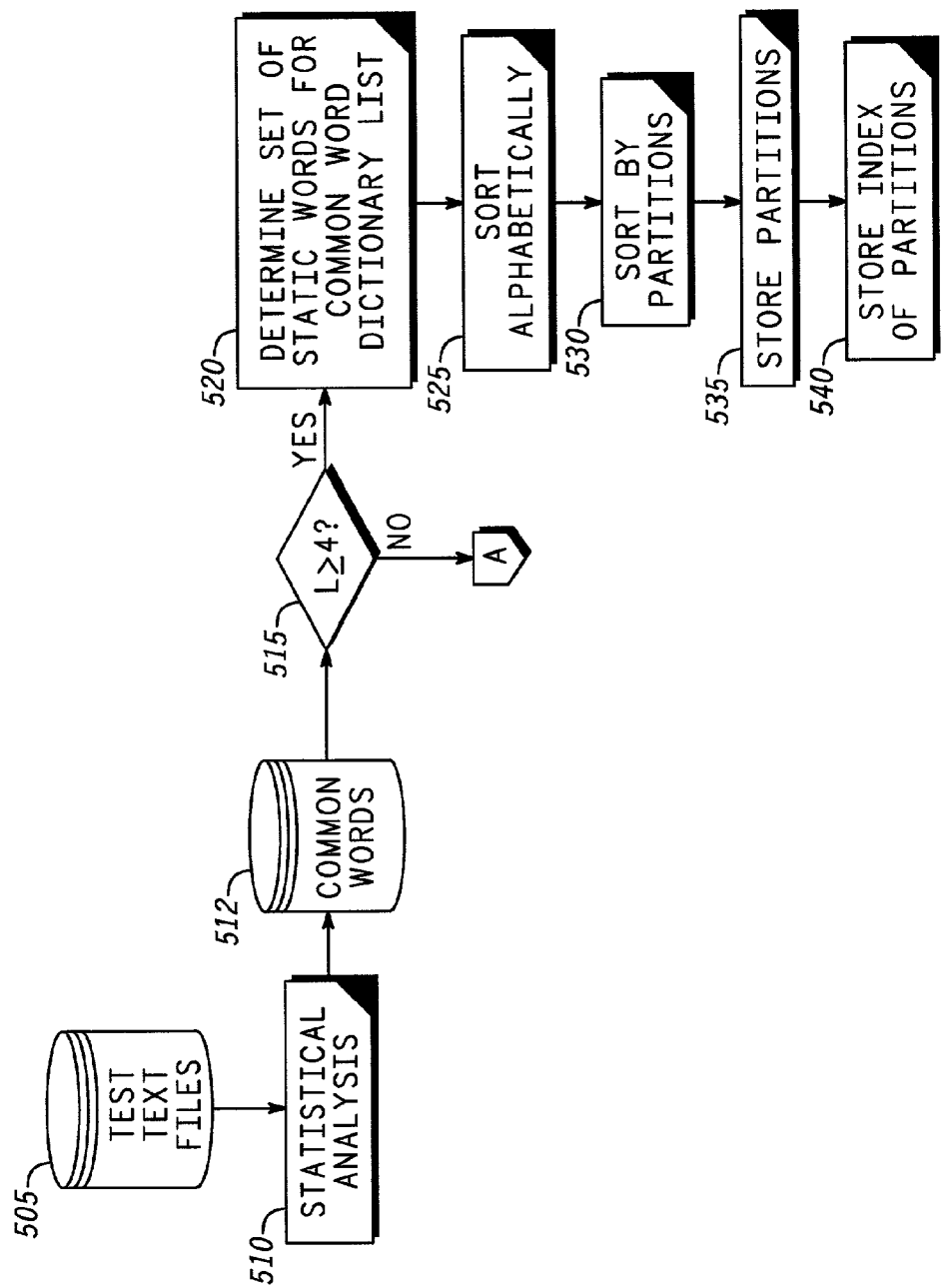
FIG. 5 is a flow chart that shows a method of generating a portion of the common word dictionary list, in accordance with the preferred embodiment of the present invention.

Referring now to FIG. 5, a flow chart shows a method of generating a portion of the CWDL 230 detailed in FIG. 4 that comprises 65,426 of the most common words of more than three characters, in accordance with the preferred embodiment of the present invention. At step 510, an off line statistical analysis of the words found in the set of test data files 505 is performed to determine the frequency of occurrence of each different word, ignoring capitalization, resulting in a set of common words 512. At step 515, words shorter than 4 characters are deleted, and the 65,426 most frequently occurring words greater than 4 characters in length are determined at step 520 to be the set of static words for the common word dictionary list 410. Words shorter than 4 characters are used, at step 615 (FIG. 6), as described below with reference to FIG. 6. The set of static words is sorted into subsets of words, each subset having a common starting character after being sorted at step 525 and a common length of the words after being sorted at step 530. Each subset of the set of words that was sorted by one of the lengths is herein named a partition and is identified by the common starting character and the length.

At step 535 each partition is stored at a starting location in memory, as illustrated in FIG. 4 by the beginning positions of the partitions 412, 415, 420, 425, 430, 435, 440, 445, which are named PARTITION A4, PARTITION A6, etc., through PARTITION Z10+ (if any 10 character or longer words starting with Z have been identified). At step 540, an index 450 of the starting locations 455, 460, 465, 470, 475, and 480 for each corresponding partition are stored, named POINTER A5, POINTER A4, POINTER Z10+, etc. These starting locations 455–480 are otherwise called the encoding pointers. In the step 530 of sorting each set of words having a common starting character into partitions, the lengths of the words start at a minimum length of 4 characters and end at maximum length of 10 characters, and include all lengths from the minimum to the maximum length. All words that are as long as or longer than the maximum length are in one partition. The steps 515, 520, 525, 530, 535, 540 are preferably performed by a computer other than the one including the processor 210, but it could be the same computer.

Figure 6:
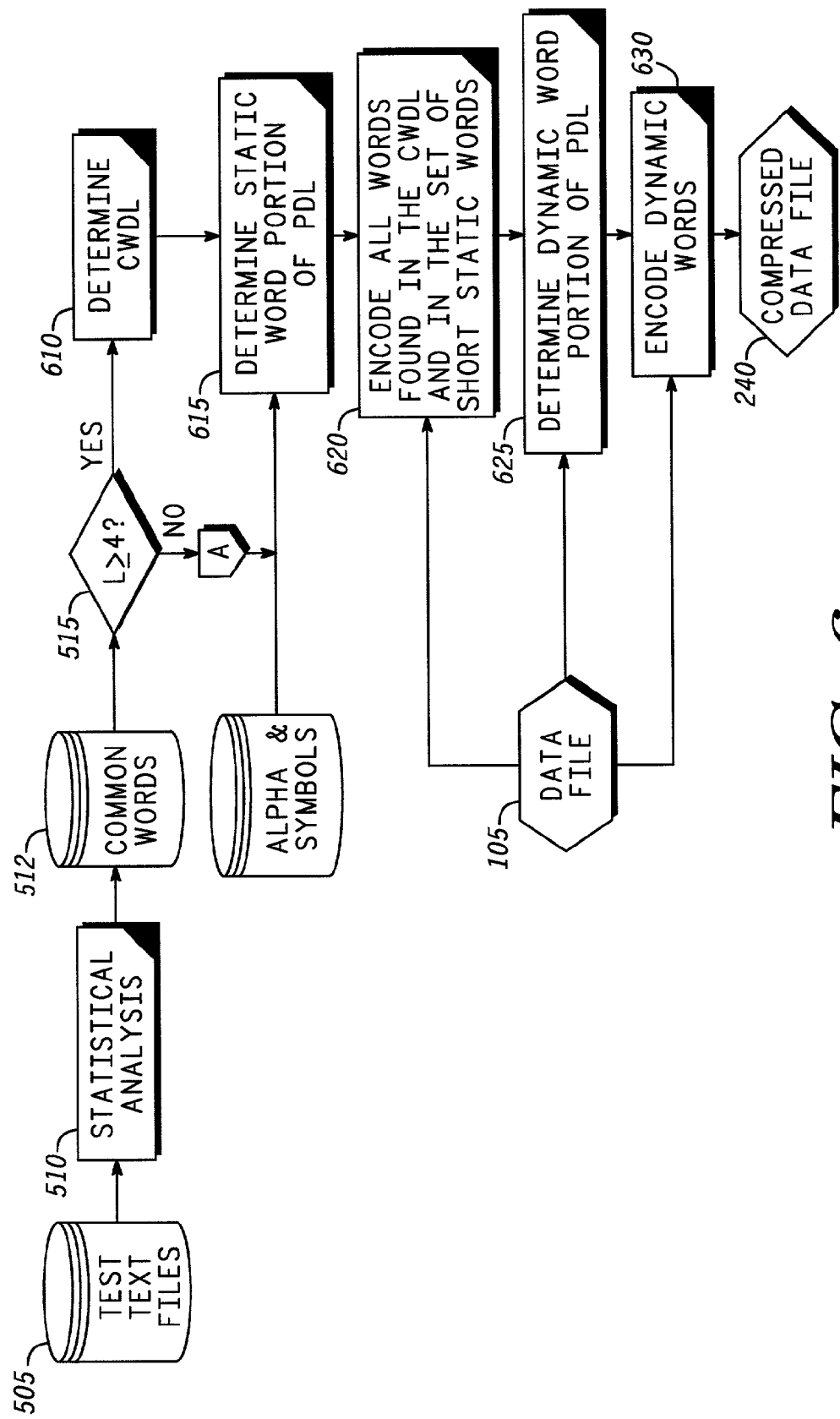
FIG. 6 is a flow chart of a method of determining a set of short static words, a dynamic portion of the primary dictionary list, and a compressed data file, in accordance with the preferred embodiment of the present invention

Referring to FIG. 6, a flow chart of a method of determining the set of short static words 313, the dynamic portion 320 of the PDL 220, and the compressed data file 240 are shown, in accordance with the preferred embodiment of the present invention. The steps 510 through 515 have already been described with reference to FIG. 5. Step 610 in FIG. 6 represents steps 520–540 of FIG. 5. At step 615, the short static portion 313 of the PDL 220 is formed in an off line process by determining the 37 most common words that are less than 4 characters long, using the statistical analysis of step 510. Eighteen ASCII symbols within the range from 128 to 255 are also identified off line, using the statistical analysis of step 510. These are added to the 128 ASCII symbols in the range from 0 to 127 to form the set of alphanumeric characters and symbols 311. In this example then, the dynamic portion 320 can include 256−146−37−3=70 words. Steps 620, 625, and 630 summarize the online process of encoding the data file 105 performed by the data compressor 110. At step 620, the words in the data file are analyzed one at a time. Those that are included in the CWDL 230 and that can be characterized by one of the three command tokens 312 (as detailed more fully below), or those that are included in the set of short static word 313 (collectively called the "statically encodable words") are encoded by substituting the corresponding primary token or common word tokens for them, in a manner described below. The "words in the data file" are initially identified as being all the character strings that are between two spaces. When all the statically encodable words have been encoded, the data compressor 110 at step 625 analyzes all the words that are not encoded (note a detail of this aspect, described below with reference to FIG. 10) to determine the 70 most frequently occurring unencoded words, and stores them in the dynamic portion 320 of the PDL 220. At step 630, the data compressor 110 substitutes dynamic tokens (one form of primary tokens) for the dynamically encoded words within the data file 105. The result is the compressed data file 240.

Figure 7:
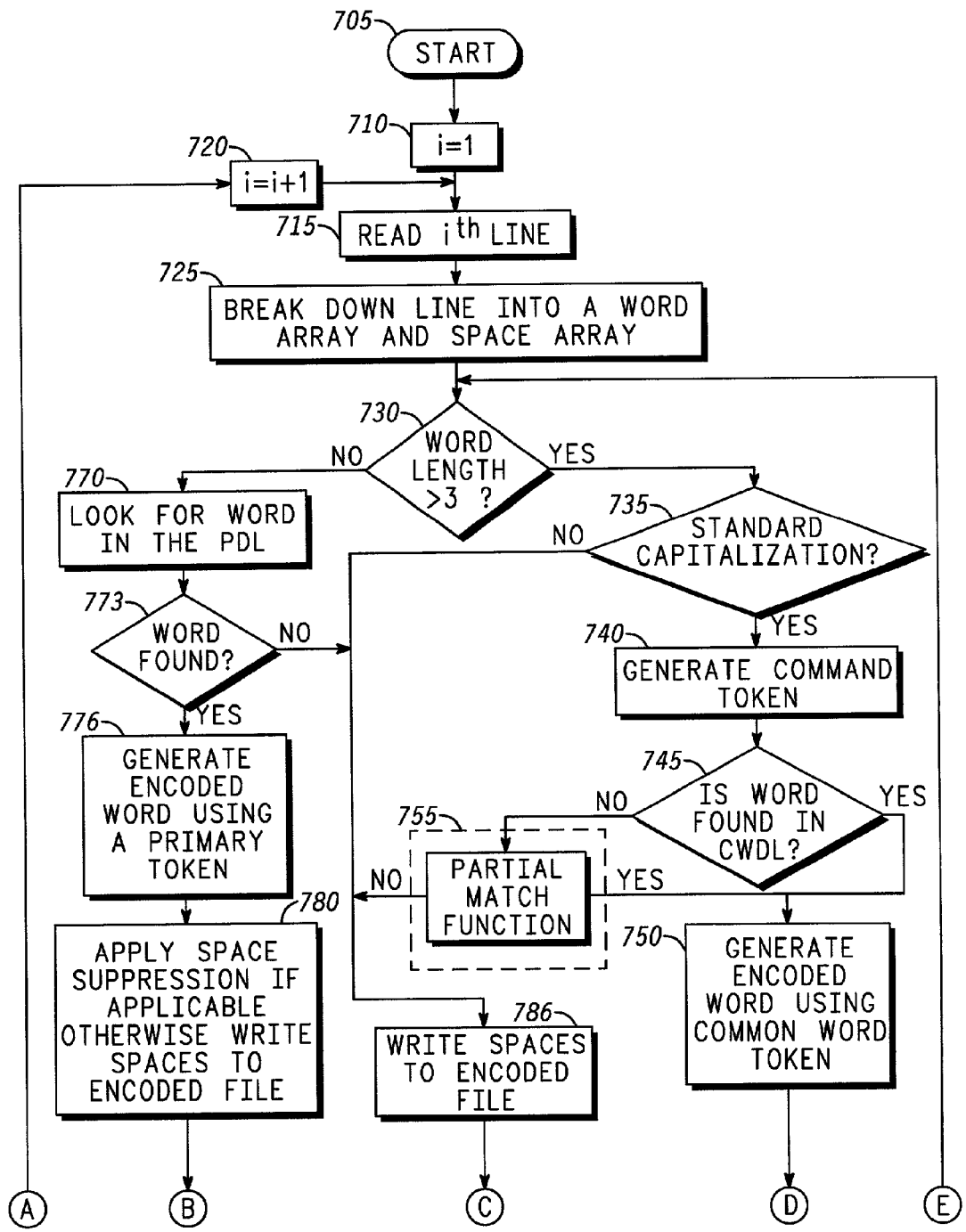
FIGS. 7 and 8 are a flow chart of a method to encode static words, in accordance with the preferred embodiment of the present invention.
Figure 8:
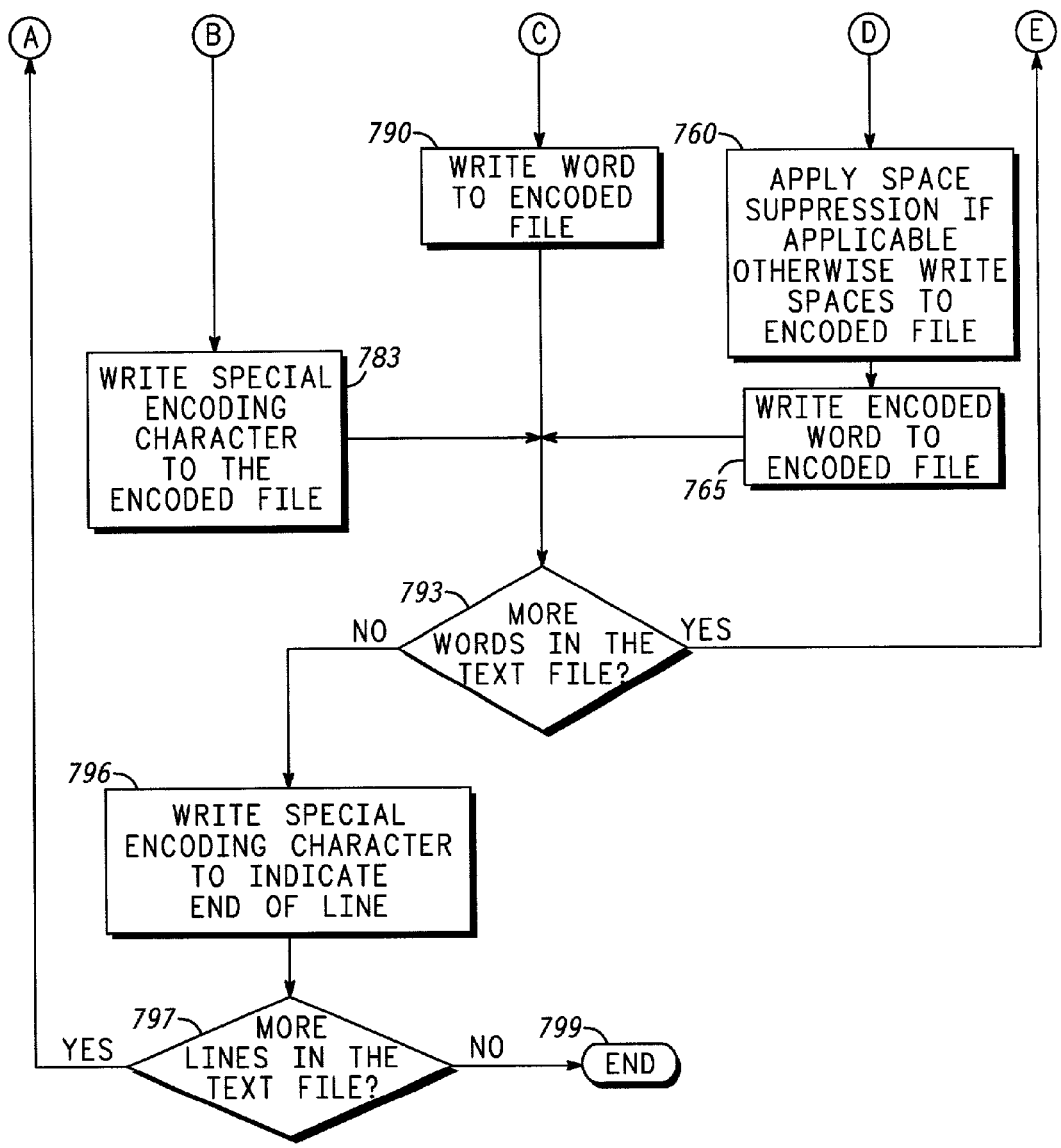
Figure 9:
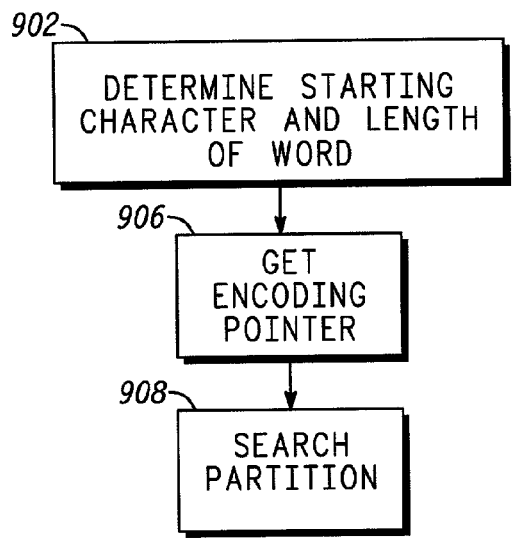
FIG. 9 is a flow chart of a search of common word dictionary used in the method to encode static words, in accordance with the preferred embodiment of the present invention.

Referring to FIGS. 7 AND 8, a flow chart of a method to encode static words is shown, in accordance with the preferred embodiment of the present invention. At steps 705, 710, 715, and 720, the data compressor 110 reads a next line of the data file. At step 725, the data compressor 110 parses the line into a word array and a space array. Each word of the word array is initially identified as described above (a string of symbols between two spaces). At step 730, a next word is analyzed to determine whether it has more than 3 characters. When it does, the word is analyzed by the right branch of the flow chart shown in FIG. 7, starting at step 735, wherein a determination is made whether the word uses one of the standard capitalizations handles by the command tokens listed above in Table 1. When the word uses such capitalization, the compressor generates the appropriate command token at step 740 and then searches the CWDL 230 (CWDL) at step 745 for a match. This search of the common word dictionary is done in a three-step process, as shown in FIG. 9. At step 902, the compressor determines the starting character and length of the word. At step 906, the starting character and length of the word are used to find an encoding pointer in the index of encoding pointers 451 (FIG. 4). The encoding pointer points to the beginning of a partition of words, as depicted in FIG. 4. The compressor then needs to search only the particular partition to determine whether there is an exact match for the word in the common word dictionary list, at step 908. It will be appreciated that this method of encoding and compressing a data file is substantially faster than ordinary alphabetic lookup methods. When an exact match is not found at step 745, the compressor performs a partial match function 755, described below with reference to FIG. 10. When an exact match is found at step 745 or a partial match is found at step 755, the data compressor 110 generates the encoded word using a common word token at step 750, and applies space suppression at step 760. Space suppression is applied by removing one space when only one space occurs between two tokenized words (that is, words that are encoded either by a primary token or a common word token). Thus, during decoding, when the data decompressor 140 encounters two adjacent tokens, the data decompressor 140 will insert a space between them. The data compressor writes a space to the compressed file at step 760 when space suppression does not apply, and writes the common word token to the compressed data file 240 at step 765.

When the word length is three characters or less at step 770, the data compressor searches for the word in the primary dictionary list (PDL) 220 at step 773. When the word is found in the PDL, the data compressor 110 generates a primary token at step 776, applies space compression in the same manner as described for step 760 above, and writes the primary token to the compressed data file 240 at step 783. When the word is not found in the PDL 220 at step 773, nor by the partial match function 755, or is found to have non-standard capitalization at step 735, the data compressor 110 writes intervening spaces to the compressed data file 240 at step 786, and writes the unencoded ASCII values that make up the word to the compressed data file 240 at step 790. At step 796, when a determination is made that there are no more lines in the data file 105, the compression is complete at step 799. When there are more lines in the data file 105, an ASCII end of line (EOL) character is added to the encoded file 240 at step 796, and the process continues at step 720. When the static encoding process is completed at step 799, the remaining unencoded strings of symbols are searched to determine the most frequently used unencoded combinations, in a conventional manner, and the combinations found are added to the PDL list 220, as described above. Then the remaining combinations are encoded with dynamic tokens, as described above.

Figure 10:
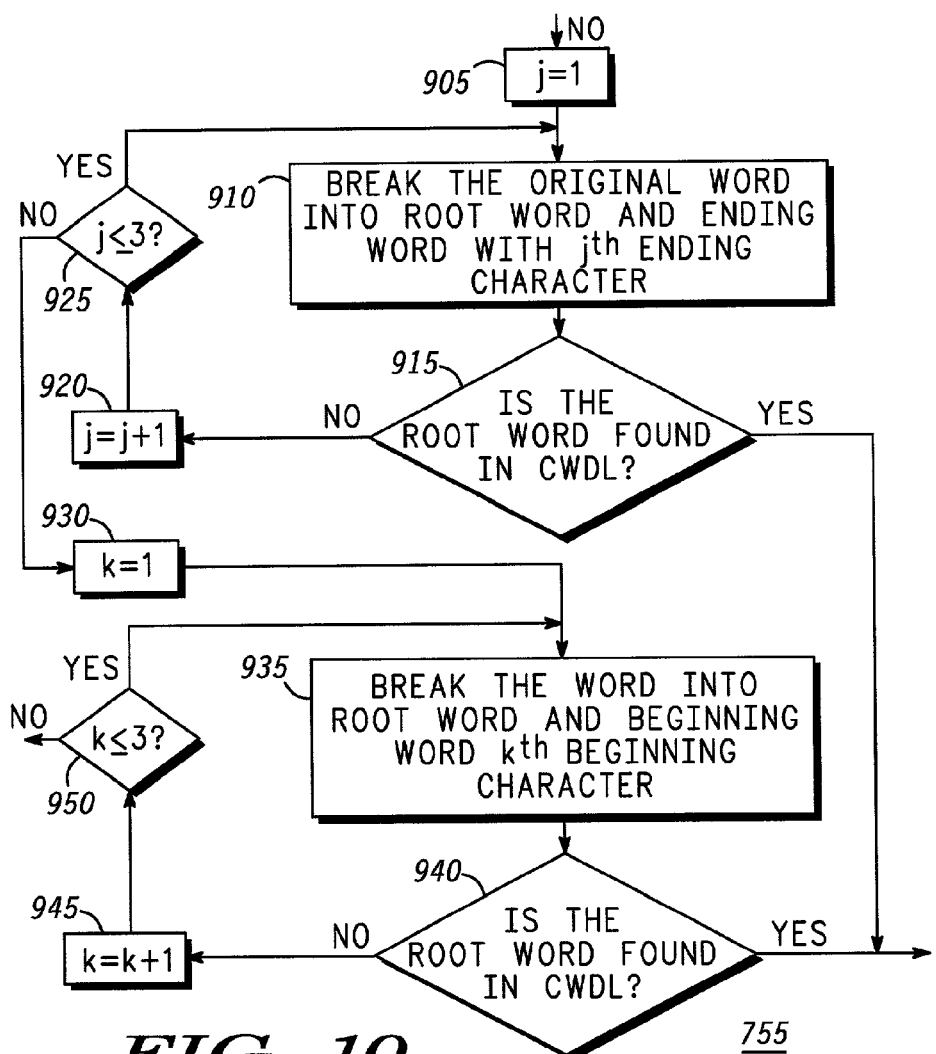
FIG. 10 is a flow chart of a partial match function used in the method to encode static words, in accordance with the preferred embodiment of the present invention.

Referring now to FIG. 10, a flow chart of the partial match function 755 is shown, in accordance with the preferred embodiment of the present invention. At step 905, a variable, j, that identifies a depth of end word separation, is set to a value of 1. The initial word is then broken into a root word and an end word, the end word being j characters (symbols) long, at step 910. A search is performed to determine at step 915 whether the root word is in the CWDL 230. When it is, the partial match function is completed and the compression process continues at step 750 (FIG. 7). When it is not, the variable j is incremented at step 920. The partial match function 755 is continued at step 910 when j is equal to or less than a maximum value at step 925. The maximum value in this example is 3. When j is greater than the maximum value, then another variable, k, that identifies a depth of beginning word separation, is set to a value of 1 at step 930. The initial word is then broken into a root word and a beginning word, the beginning word being k characters (symbols) long, at step 935. A search is performed to determine at step 940 whether the root word is in the CWDL 230. When it is, the partial match function is completed and the compression process continues at step 750 (FIG. 7). When it is not, the variable k is incremented at step 945. The partial match function 755 is continued at step 935 when k is equal to or less than a maximum value at step 950. The maximum value in this example is 3. When k is greater than the maximum value, no partial word match has been found and the compression process continues at step 786 (FIG. 7). It is noted that only a root word found by partial matching is encoded; a beginning or ending word is not encoded even if it occurs in the PDL or CWDL. When the data compressor 110 generates the dynamic portion 320 of the PDL 220, beginning and ending words that result from successful partial word matches are ignored when determining which words are the most frequently used and when encoding the words. These rules are used to provide correct space suppression.

In a first variation of the preferred embodiment of the present invention, the ASCII symbols that are removed from the PDL 220 and placed into the CWDL 230 are simply dropped and "text only" files can then be compressed by the compressor 110. This alternative works fine in those situations where the rarely used ASCII symbols that are removed from the PDL are never found in files that are to be encoded. In a modification to this first alternative embodiment, the data file 105 can be prefiltered to substitute a predetermined encodable ASCII symbol for any of the unencodable ASCII symbols.

In a second variation of the preferred embodiment of the present invention, there is no generation of, or encoding using, dynamic tokens.

Figure 11:
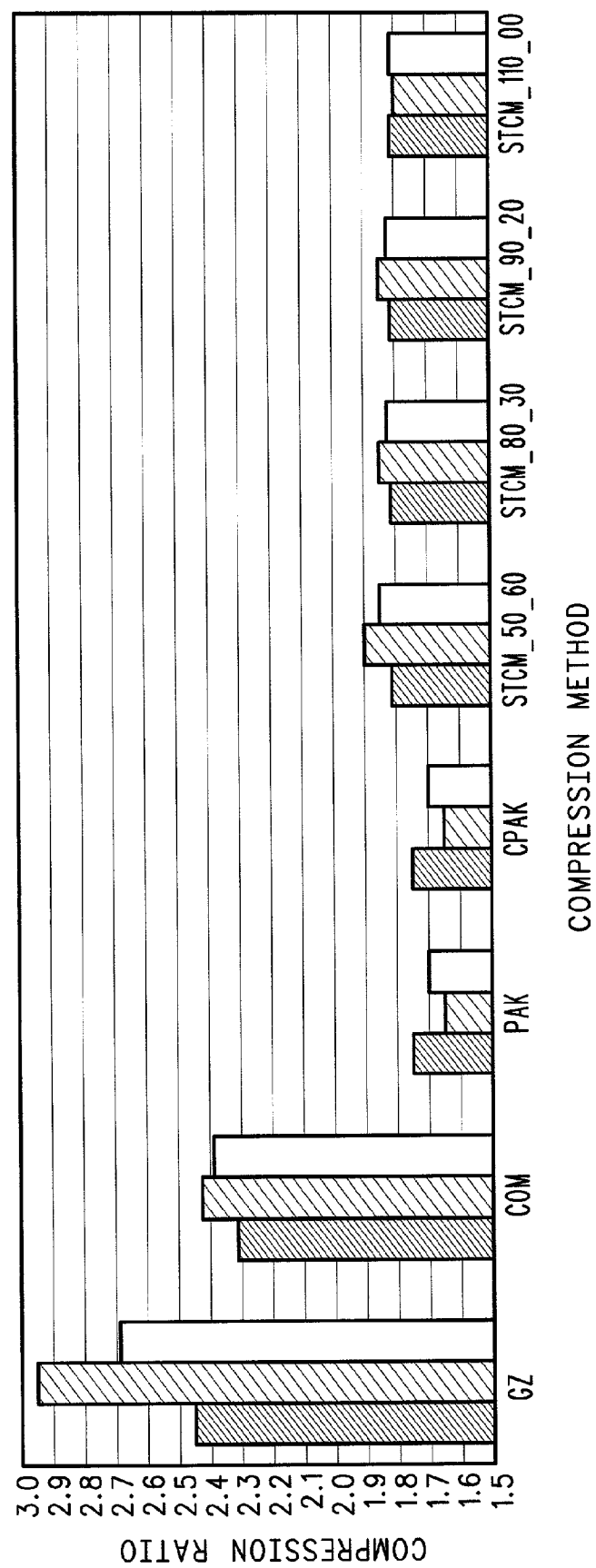
FIG. 11 is a bar graph of compression performance of an implementation of the present invention, in accordance with a first variation of the preferred embodiment.

Referring to FIG. 11, a bar graph of compression performance of an implementation of the present invention is shown in comparison to the performance of other conventional compression techniques. The implementation of the present invention used for these measurements uses 110 tokens in a PDL that has a total of 256 token and ASCII symbol values, and a CWDL of 65,536 common words. The 110 tokens are split into sets of "SS" primary tokens and "DD" dynamic tokens. The number of each type of token used for the results shown in FIG. 11 is indicated in the following manner: STCM_SS_DD. Book1 and Book2 files from the Calgary Text Compression Corpus are used to provide the data files for compression. The implementation tested uses the first variation of the preferred embodiment of the present invention ("text only" files), but the results would vary unnoticeably when using the preferred embodiment. The meaning of the abbreviations used in FIG. 11 is as follows:

STCM—The present invention (Synergistic Text Compression Method)
GZ—Gzip (A well known variation of the Lemple-Ziv-Welch compression algorithm LZ77)
COM—Compress (A well known variation of the Lemple-Ziv-Welch compression algorithm LZ78)
CPAK—PACK (A well known compression algorithm using Huffman coding)
PAK—Compact (A well known compression algorithm using adaptive Huffman coding)

Performance of the above listed compression techniques is illustrated in FIG. 11 by groups of bars. The left bar in each group represents the performance of a technique with the Book1 file, the center bar represents the performance of a technique with the Book2 file, and the right bar represents an average performance of a technique with the Book1 and Book2 files.

It can be seen in FIG. 11 that the present invention provides a compression technique that has a compression ratio that is better than PAK or CPAK. While the compression performance of the present invention is less than that of GZ or COM, it is important to note that GZ and COM are very sensitive to errors, to the extent where they are not well suited for certain uses without an overlay of error protection, which reduces their compression ratio.

It will be appreciated that the present invention provides compression encoding of a data file that has a combination of speed, compression ratio, and error performance that is better than existing compression techniques.

Figure 12:
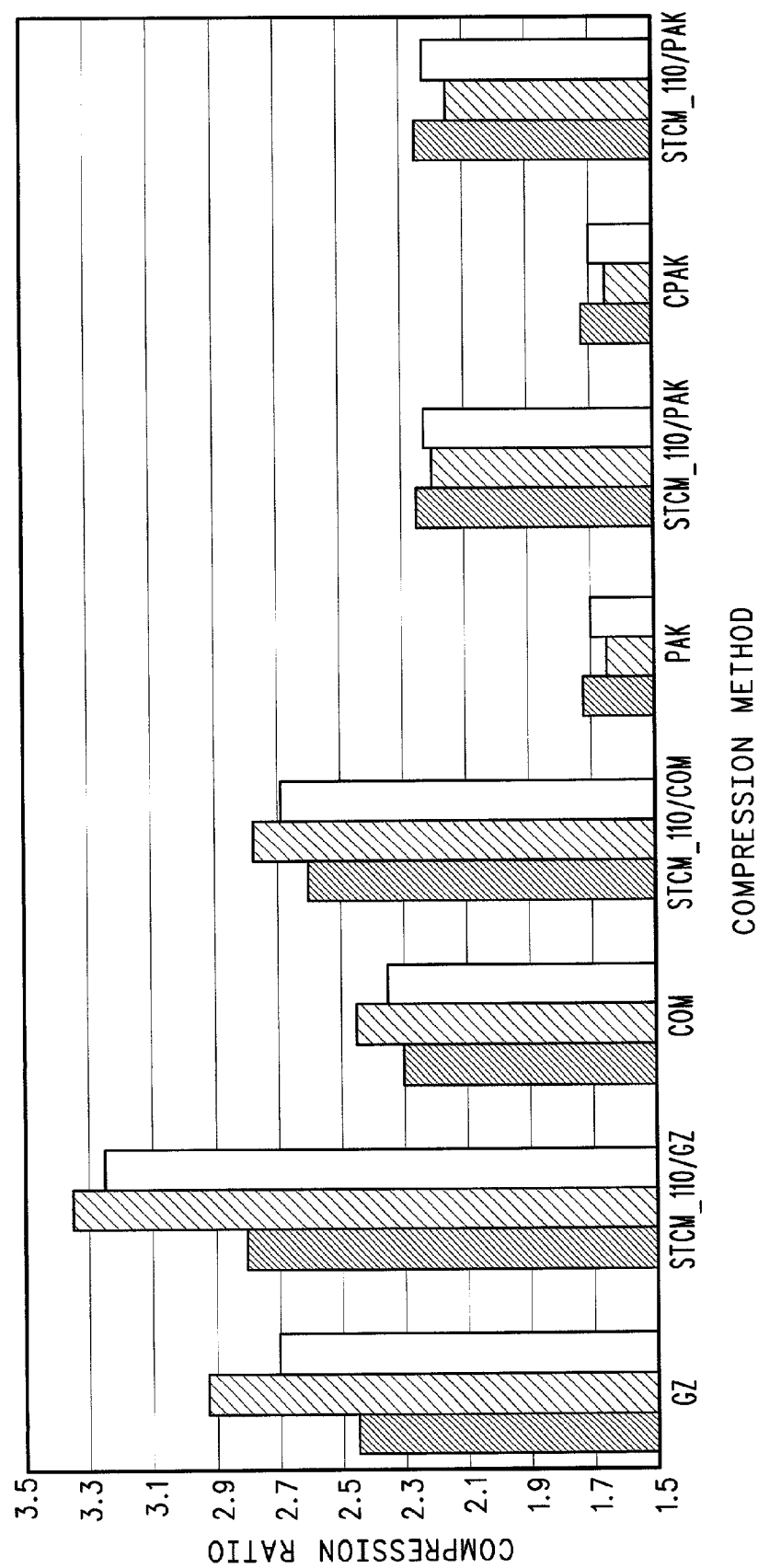
FIG. 12 is a bar graph of compression performance of an implementation of the present invention using cascaded compression, in accordance with the preferred embodiment of the present invention.

Referring to FIG. 12, a bar graph of compression performance of an implementation of the present invention using cascaded compression is shown. The implementation of the present invention used for these measurements uses 110 tokens in a PDL that has a total of 256 token and ASCII symbol values, and a CWDL of 65,536 common words. The 110 tokens are primary tokens. Book1 and Book2 from the Calgary Text Compression Corpus are used to provide the data files for compression. The implementation tested uses the first variation of the preferred embodiment of the present invention ("text only" files), but the results would vary unnoticeably when using the preferred embodiment. The meaning of the abbreviations used in FIG. 12 is the same as in FIG. 11.

Performance of the above-listed cascaded compression techniques is illustrated in FIG. 12 by groups of bars that are identified by two abbreviations separated by a slash; the other groups of bars show the performance of the identified method without compression.

The left bar in each group represents the performance of a technique with the Book1 file, the center bar represents the performance of a technique with the Book2 file, and the right bar represents an average performance of a technique with the Book1 and Book2 files.

From the figure, it can be seen that the present invention, unlike most popular compression utilities, can be used in cascade with other compression utilities to advantageously further improve the compression ratio. In all cases, the compression was performed using the present invention first, and the resulting compressed file was further compressed using one of the conventional techniques indicated in FIG. 12.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

We claim:

1. A method of compressing a data file using tokens that identify symbol strings stored in one or more dictionaries, comprising the steps of:
   determining that two successive symbol strings in a data file are represented by two tokens that are not necessarily different;
   determining that the two successive symbol strings are separated only by a space; and
   encoding the two successive symbol strings in a compressed data file by arranging the two tokens adjacently, without an intervening space symbol.

* * * * *